United States Patent
Kanamori

(10) Patent No.: US 10,634,329 B2
(45) Date of Patent: Apr. 28, 2020

(54) LAMP UNIT AND MANUFACTURING METHOD THEREOF

(71) Applicant: KOITO MANUFACTURING CO., LTD., Tokyo (JP)

(72) Inventor: Akitaka Kanamori, Shizuoka (JP)

(73) Assignee: KOITO MANUFACTURING CO., LTD., Minato-ku, Tokyo (JP)

( * ) Notice: Subject to any disclaimer, the term of this patent is extended or adjusted under 35 U.S.C. 154(b) by 0 days.

(21) Appl. No.: 16/427,754

(22) Filed: May 31, 2019

(65) Prior Publication Data

US 2019/0368707 A1 Dec. 5, 2019

(30) Foreign Application Priority Data

Jun. 5, 2018 (JP) .................................. 2018-107780

(51) Int. Cl.
| | | |
|---|---|---|
| *F21S 41/141* | (2018.01) | |
| *F21V 23/00* | (2015.01) | |
| *F21V 5/00* | (2018.01) | |
| *H05K 1/02* | (2006.01) | |

(52) U.S. Cl.
CPC .......... *F21V 23/004* (2013.01); *F21S 41/141* (2018.01); *F21V 5/007* (2013.01); *F21V 23/007* (2013.01); *H05K 1/028* (2013.01)

(58) Field of Classification Search
CPC ........ F21V 23/00; F21V 5/007; F21V 23/007; F21S 41/141; F21S 41/143; F21S 41/145
See application file for complete search history.

(56) References Cited

U.S. PATENT DOCUMENTS

| | | | | |
|---|---|---|---|---|
| 2010/0290241 | A1* | 11/2010 | Tsukamoto | B60Q 1/0047 362/519 |
| 2011/0051448 | A1* | 3/2011 | Owada | B60Q 1/0683 362/520 |
| 2013/0051053 | A1 | 2/2013 | Yasuda | |
| 2013/0135882 | A1* | 5/2013 | Choi | B60Q 1/2696 362/487 |
| 2014/0063805 | A1* | 3/2014 | Song | F21V 29/50 362/249.01 |
| 2014/0241008 | A1* | 8/2014 | Kim | G02B 6/0083 362/615 |
| 2015/0036369 | A1* | 2/2015 | Kim | F21S 45/48 362/487 |
| 2015/0198320 | A1* | 7/2015 | Kim | F21V 19/003 362/294 |
| 2018/0156407 | A1* | 6/2018 | Lee | H05B 33/0803 |
| 2018/0363872 | A1* | 12/2018 | Jo | F21S 41/141 |

FOREIGN PATENT DOCUMENTS

JP 2013-45601 A 3/2013

* cited by examiner

*Primary Examiner* — Anabel Ton
(74) *Attorney, Agent, or Firm* — Sughrue Mion, PLLC

(57) ABSTRACT

A lamp unit includes: a light source module; and an optical system for projecting light emitted from the light source module with a required light distribution. The light source module includes a thermally-conductive plate, a circuit board attached to the thermally-conductive plate, and a light emitting element mounted on the circuit board and powered via the circuit board. The thermally-conductive plate is provided with a mounting portion for mounting the optical system at a predetermined position with the light emitting element as a reference.

11 Claims, 6 Drawing Sheets

LAMP UNIT AND MANUFACTURING METHOD THEREOF

CROSS-REFERENCE TO RELATED APPLICATIONS

This application is based on and claims priority under 35 USC 119 from Japanese Patent Application No. 2018-107780 filed on Jun. 5, 2018, the contents of which are incorporated herein by reference.

TECHNICAL FIELD

The disclosure relates to a lamp unit suitable for use in a vehicle such as an automobile and, more particularly, to a lamp unit using a light emitting element such as an LED (light emitting diode) as a light source and a manufacturing method thereof.

BACKGROUND ART

A projector type lamp using an LED as a light source is provided as a lamp of an automobile, for example, a headlamp. In this type of lamp, a light source and an optical system for irradiating light emitted from the light source with a required light distribution are included as a unit. JP-A-2013-45601 (PTL 1) discloses a vehicle lamp including a lamp unit in which an LED module is configured by mounting an LED on a power feeding board made of ceramic with high thermal conductivity and the LED module is attached to a heat sink together with an optical system.

Such a light source unit needs a configuration for electrically connecting to an external power supply to make the LED emit light. Further, such a light source unit is required to be disposed in a specific positional relationship with respect to an optical member such as a reflector or a projection lens for irradiating light emitted from the LED toward the front of the lamp.

In JP-A-2013-45601, the LED module is positioned and attached to the heat sink by using an attachment. In this manner, the LED module is positioned and electrically connected to the external power supply by a wiring member provided in the attachment.

In JP-A-2013-45601, the power feeding board constituting the LED module is made of ceramic which is a thermally-conductive insulating member. The reason is that an insulating member with high thermal conductivity is used so as to form a wiring member for feeding power to the LED on the power feeding board and to improve the heat dissipation effect of heat generated when the LED emits light. In general, since the power feeding board made of ceramic is expensive, the LED module or the lamp unit including such LED module is also expensive.

Further, in JP-A-2013-45601, the attachment for positioning and mounting the LED module on the heat sink is provided so as to improve the light distribution characteristic of the lamp unit. Therefore, the number of parts of the lamp unit is increased. Further, since the attachment forms the wiring member for feeding power to the LED, the structure is complicated and expensive, and the lamp unit becomes more expensive.

An object of the disclosure is to provide a lamp unit capable of reducing the number of parts and achieving low cost without deteriorating the heat dissipation effect and the light distribution characteristic, and a method of manufacturing the lamp unit.

SUMMARY OF INVENTION

A lamp unit includes: a light source module; and an optical system for projecting light emitted from the light source module with a required light distribution. The light source module includes a thermally-conductive plate, a circuit board attached to the thermally-conductive plate, and a light emitting element mounted on the circuit board and powered via the circuit board, and the thermally-conductive plate is provided with a mounting portion for mounting the optical system at a predetermined position with the light emitting element as a reference.

The thermally-conductive plate may include a metal plate. The circuit board may include an FPC (Flexible Printed Circuit board) and may be supported on the thermally-conductive plate, and the light emitting element may be mounted on the FPC. The optical system may include at least one of a reflector for reflecting light emitted from the light emitting element and a projection lens for projecting light emitted from the light emitting element with a required light distribution.

The thermally-conductive plate may include a part of a base supporting the optical system. A mounting hole into which a protrusion provided on the optical system is inserted may be opened as a mounting portion of the optical system in the thermally-conductive plate.

A method of manufacturing a lamp unit includes: a process of mounting a circuit board provided with a light emitting element on a thermally-conductive plate; and a process of providing a mounting portion for mounting an optical system at a predetermined position of the thermally-conductive plate with the light emitting element as a reference. The process of providing the mounting portion may include a process of drilling a hole by a laser processing.

According to the disclosure, the heat dissipation characteristics of the light emitting element can be enhanced by mounting the light emitting element on the thermally-conductive plate. Further, since the mounting portion of the optical system provided on the thermally-conductive plate is disposed at a predetermined position with the mounted light emitting element as a reference, it is possible to provide the lamp unit in which the light distribution characteristics are excellent by increasing the positional accuracy of the relative position between the light emitting element and the optical system and in which the number of parts is reduced and the low cost is achieved.

DESCRIPTION OF EMBODIMENTS

First Embodiment

Figure 1:
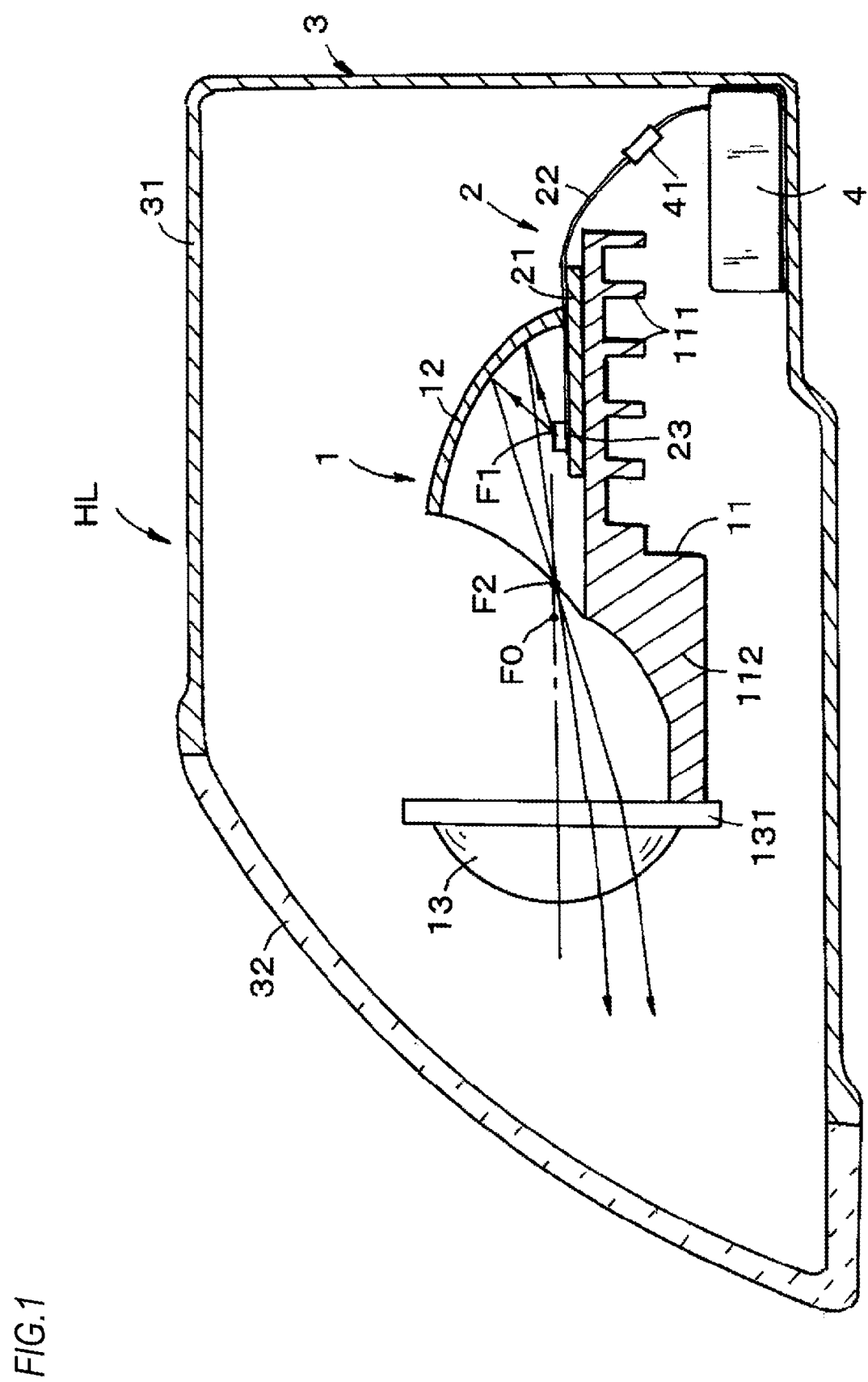
FIG. 1 is a schematic sectional view of a headlamp provided with a lamp unit of the disclosure.

Next, an embodiment of the disclosure will be described with reference to the drawings. FIG. 1 is a longitudinal sectional view of a first embodiment in which a lamp unit 1 of the disclosure is applied to a headlamp HL of an automobile. The lamp unit 1 is installed inside a lamp housing 3 of the headlamp HL and a light source module 2 is incorporated in the lamp unit 1. The lamp housing 3 includes a container-shaped lamp body 31 and a translucent front cover 32 attached to a front opening of the lamp body 31.

The lamp unit 1 has a base 11 made of a metal such as aluminum, and the light source module 2 is mounted on the base 11. The base 11 is configured as a heat sink. On a lower surface of the base 11, a plurality of wall-shaped heat dissipation fins 111 are formed to protrude downward in an arrayed state. The light source module 2 is mounted in close contact with an upper surface of the base. Heat generated when the light source module 2 emits light is dissipated from the heat dissipation fins 111.

Further, a reflector 12 and a projection lens 13 are supported on the base 11. The reflector 12 has a generally spheroidal reflective surface and is attached to the base 11 so as to cover the light source module 2. Further, the projection lens 13 is supported by a lens holder 131 at its peripheral edge portion. The lens holder 131 is supported by a stem 112 extending forward from the base 11. In this way, the reflector 12 and the projection lens 13 are supported with respect to the base 11 in a predetermined position relationship.

The lamp unit 1 is configured as a projector-type lamp that performs illumination by reflecting light emitted from the light source module 2 by the reflector 12 and projecting the reflected light onto a front area of an automobile with a required light distribution by the projection lens 13.

Figure 2A:
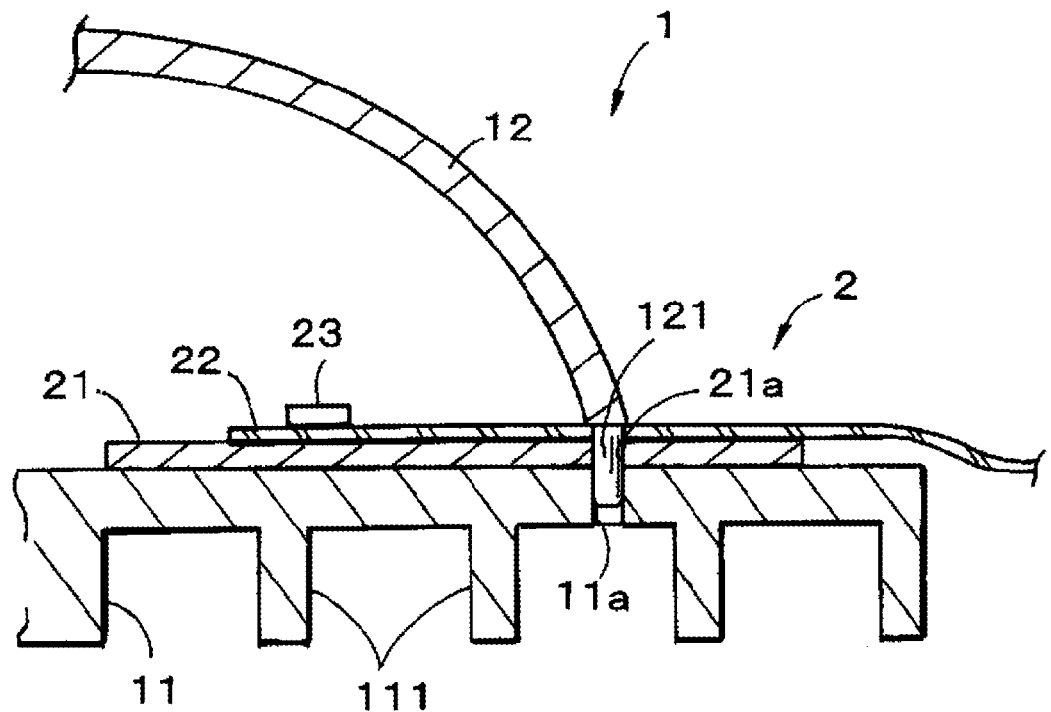
FIG. 2A is a partial sectional view of a lamp unit provided with a light source module in a first embodiment.
Figure 2B:
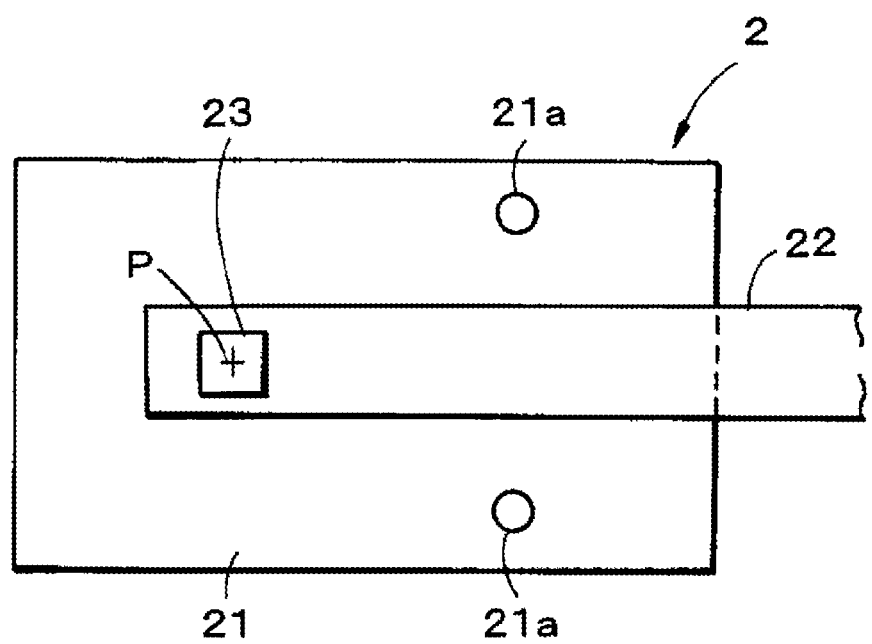
FIG. 2B is a schematic plan view of the light source module.
Figure 3:
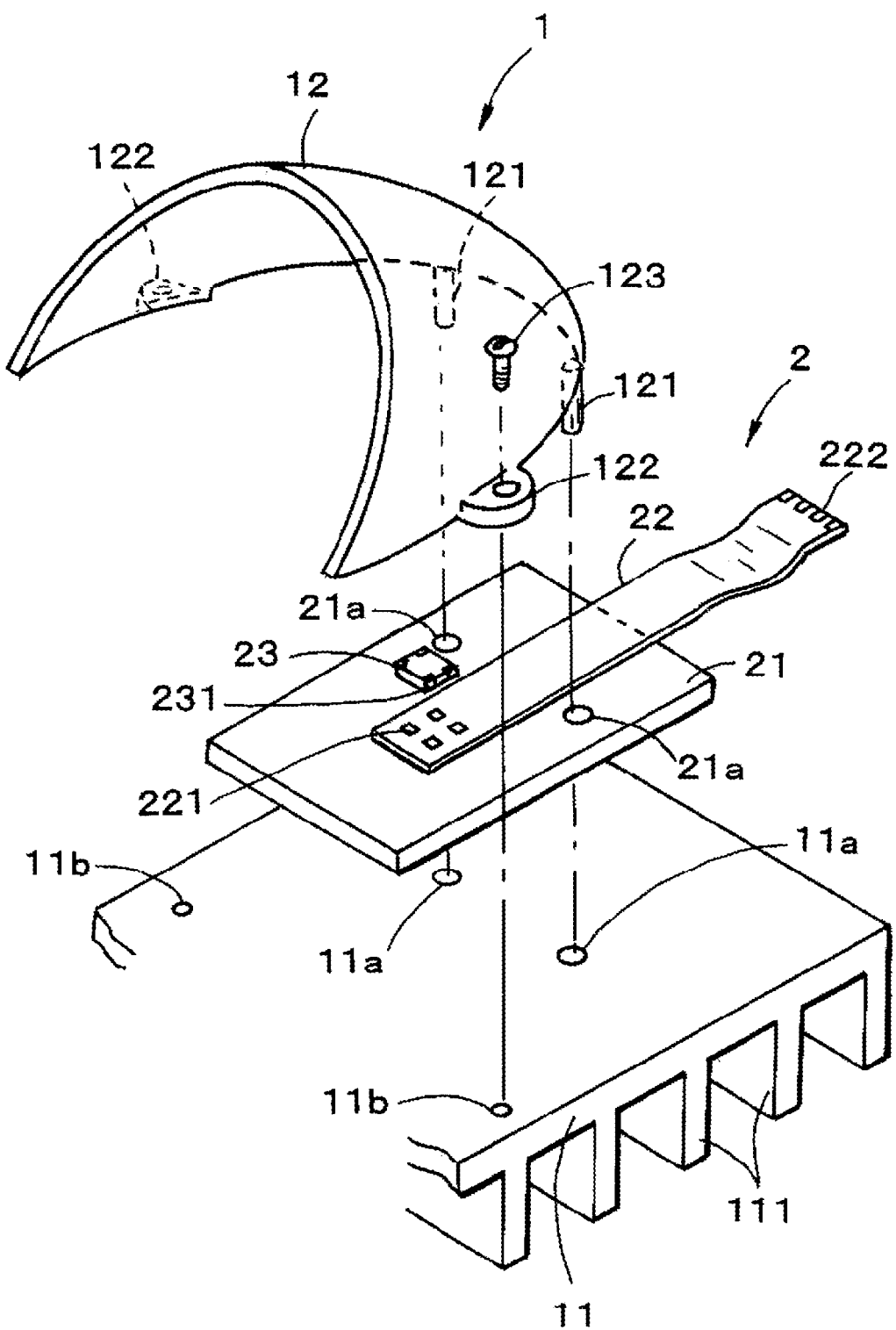
FIG. 3 is a partial exploded perspective view of the lamp unit according to the first embodiment.

FIGS. 2A and 2B are a sectional view of a main part of the lamp unit 1 provided with the light source module 2 and a plan view of the light source module 2, and FIG. 3 is an exploded perspective view thereof. The light source module 2 includes a rectangular thermally-conductive plate having a required dimension, in this embodiment, a metal plate 21 made of aluminum. An FPC (Flexible Printed Circuit board) 22 is bonded to the surface (upper surface) of the metal plate 21. Further, a chip-like light emitting element, in this embodiment, an LED chip (hereinafter, simply referred to as LED) 23 is mounted on the surface of the FPC 22.

The light source module 2 will be described together with the manufacturing process thereof. In the FPC 22, a circuit pattern is configured by bonding a conductive wiring member such as copper foil to a flexible insulation film such as polyimide. The FPC 22 is formed in an elongated strip shape. A pad 221 for electrically connecting the LED 23 is formed as a part of the circuit pattern on the surface (upper surface) on one end side of the FPC 22 in a longitudinal direction. The LED 23 is mounted in a state of being electrically connected to the circuit pattern of the FPC 22 by a flip chip, that is, by soldering an electrode 231 provided in the LED 23 to the pad 221 with its light emitting surface directed upward. The FPC 22 is supported on the metal plate 21 by being adhered to the surface of the metal plate 21 at the back surface (lower surface) of the area on the one end side with an adhesive.

The area on the other end side of the FPC 22 extends from the metal plate 21 and a connector portion 222 is formed at the other end portion thereof. Here, the connector portion 222 is configured as an edge connector using a circuit pattern. Further, as shown in FIG. 1, the connector portion 222 is fitted to a power supply-side connector 41 electrically connected to a lighting circuit device 4 installed inside the lamp housing 3 and is electrically connected to the lighting circuit device 4.

Circular first mounting holes 21a are opened to penetrate in a plate thickness direction at two places of the metal plate 21 sandwiching the supported FPC 22 in a width direction. Even when the FPC 22 on which the LED 23 is mounted is supported on the metal plate 21, the holes can be easily opened in the metal plate 21 using machining or laser processing. Therefore, the two first mounting holes 21a can be opened at positions having a specific positional relationship with the LED 23 as a reference (namely, a specific positional relationship with respect to the LED 23). That is, a light emission center of the LED 23, in other words, a center position P of a light emitting surface from which the emitted light is emitted is set as a reference position. The first mounting holes 21a are opened at positions where the relative position between the reference position P and opening center positions of the first mounting holes 21a has a predetermined dimensional relationship respectively in a longitudinal direction and a width direction of the FPC 22.

On the other hand, two second mounting holes 11a are opened at predetermined positions of the base 11 set in advance so as to correspond to the first mounting holes 21a of the metal plate 21. That is, the second mounting holes 11a are opened at positions having a predetermined positional relationship with respect to the projection lens 13 supported on the base 11. In the first embodiment, the base 11 is formed by aluminum die casting and the second mounting holes 11a are opened when the base 11 is molded. However, the second mounting holes 11a may be opened after the base 11 is molded. Further, the second mounting holes 11a are provided at places where the heat dissipation fins 111 do not exist.

As shown in FIGS. 2A, 2B and 3, the light source module 2 configured in this way is mounted on the surface of the base 11. When mounting the light source module 2, the two first mounting holes 21a of the metal plate 21 are positioned so as to coincide with the second mounting holes 11a of the base 11, respectively. Subsequently, the reflector 12 is attached so as to cover the surface of the metal plate 21. The reflector 12 has two columnar protrusions 121 formed to protrude downward at two places of its lower edge. These protrusions 121 are inserted through the first mounting holes 21a and further inserted into the second mounting holes 11a.

With this insertion, the protrusions 121 are fitted into the first mounting holes 21a and the second mounting holes 11a, respectively. In this manner, the reflector 12 is positioned with respect to the metal plate 21 and the base 11. Further, the reflector 12 is fixedly supported on the base 11 by screwing screws 123 into screw holes 11b opened in the base 11 using fixing pieces 122 provided on the reflector 12.

Meanwhile, a grease or grease sheet with high thermal conductivity may be interposed on the contact surface between the metal plate 21 and the base 11 to enhance the thermal conductivity at the interface between the metal plate 21 and the base 11, thereby improving the heat dissipation effect of the LED 23.

In the lamp unit 1 provided with the light source module 2, the LED 23 is supplied with power from the lighting circuit device 4 via the FPC 22 and emits light. As schematically shown in FIG. 1, the emitted light is reflected by the reflector 12 and is incident on the projection lens 13. Then, the projection lens 13 causes the emitted light to be irradiated to the front area of an automobile with a required light distribution. The reflector 12 is positioned in a predetermined positional relationship with respect to the base 11 and the metal plate 21 by the first mounting holes 21a and the second mounting holes 11a. Therefore, the reflector 12 is supported in a predetermined positional relationship with respect to the FPC 22 mounted on the metal plate 21 and also the LED 23 mounted on the FPC 22.

In this way, a first focal point F1 of the reflector 12 can be positioned with high accuracy with respect to the light emission center P of the LED 23. The light reflected by the reflector 12 is collected at a second focal point F2 of the reflector 12. Further, since the projection lens 13 is positioned with respect to the base 11, the projection lens 13 is also positioned in a predetermined positional relationship with respect to the reflector 12 via the base 11 and the metal plate 21, and a focal point F0 of the projection lens 13 can be set in a predetermined positional relationship with respect to the second focal point F2 of the reflector 12. In this manner, a predetermined light distribution by the projection lens 13 can be obtained.

In the first embodiment, the LED 23 is mounted on the FPC 22 and electrically connected to the lighting circuit device 4 via the FPC 22. Therefore, unlike JP-A-2013-45601, the power feeding board made of an insulating material can be replaced with the metal plate 21 and cost reduction can be achieved. Further, the heat generated when the LED 23 emits light is transferred to the base 11 serving as a heat sink via the metal plate 21 and dissipated therefrom, so that the heat dissipation effect can be improved.

Figure 4A:
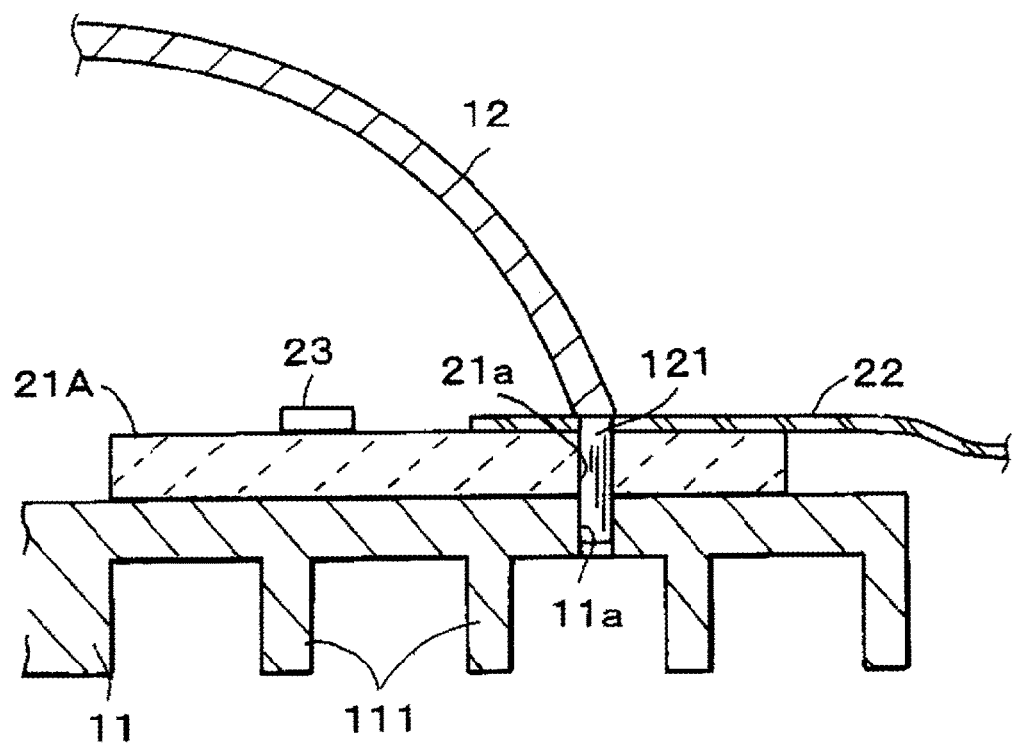
FIG. 4A is a partial sectional view of a lamp unit provided with a light source module in a reference embodiment.
Figure 4B:
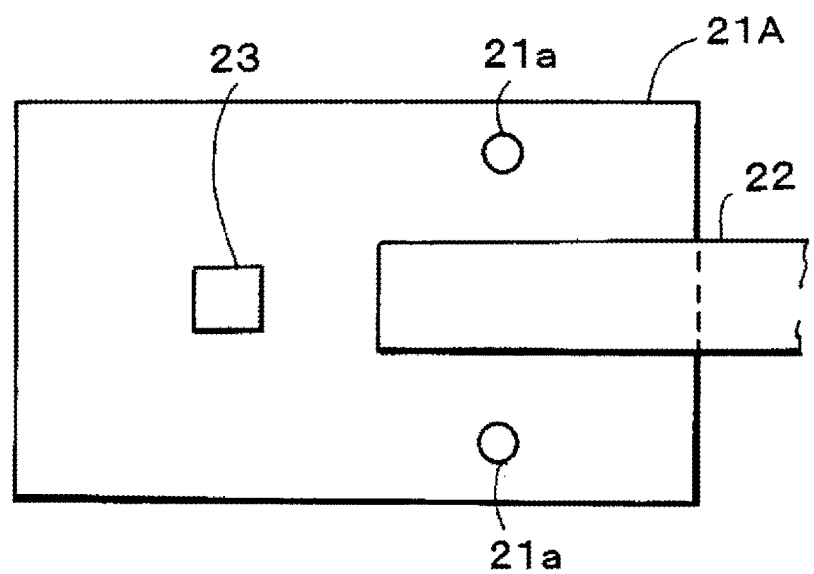
FIG. 4B is a schematic plan view of the light source module.

By the way, when the light source module disclosed of JP-A-2013-45601 is applied to the lamp unit of the first embodiment, as shown in the sectional view of FIG. 4A and the plan view of FIG. 4B, the LED 23 is mounted on a power feeding board 21A and the FPC 22 is connected to the power feeding board 21A. And then, the power feeding board 21A is supported on the base 11 and electrically connected to a lighting circuit device. Therefore, the power feeding board 21A needs to form a circuit pattern on a thermally-conductive insulating board, which causes a cost increase.

Further, in the first embodiment, the FPC 22 on which the LED 23 is mounted is attached to the metal plate 21, and then, the two first mounting holes 21a are opened at predetermined positions of the metal plate 21 with the light emission center P of the LED 23 as a reference (namely, predetermined positions of the metal plate 21 with respect to the light emission center P of the LED 23). Therefore, even when the accuracy (error) of the mounting position of the LED 23, that is, the accuracy when attaching the FPC 22 to the metal plate 21 is about ±0.2 mm, regardless of this, the positional accuracy of the first mounting holes 21a relative to the light emission center P of the LED 23 can be made ±0.12 mm or less of the maximum accuracy in the drilling process.

In the configuration using the power feeding board 21A shown in FIGS. 4A and 4B, it is difficult to open the holes after the power feeding board 21A is formed, and thus, it is necessary to open the first mounting holes 21a when forming the power feeding board 21A. Therefore, even when the first mounting holes 21a are opened at predetermined positions of the power feeding board 21A, the accuracy of about ±0.2 mm when the LED 23 is mounted on the power feeding board 21A is generated as a position error between the LED 23 and the first mounting hole 21a as it is.

Machining or laser processing is used in the process of drilling the first mounting holes 21a in the metal plate 21. However, since the positional accuracy of the first mounting holes 21a by the laser processing is ±0.05 mm or less, which is ½ or less of the machining. Therefore, the laser processing is advantageous.

As described above, in the first embodiment, the light source module 2 includes the metal plate 21 and the FPC 22 on which the LED 23 is mounted. Therefore, the attachment described in JP-A-2013-45601 is not necessary, and the number of parts can be reduced and the cost reduction can be achieved. Further, since the LED 23 is mounted on the FPC 22, the power feeding board made of ceramic or the like for constituting a power feeding circuit is not necessary and the cost reduction can be achieved. Furthermore, since the metal plate 21 is used, the heat dissipation effect of the LED can be improved.

On the other hand, the first mounting holes 21a are opened in the metal plate 21 with the LED 23 mounted on the metal plate 21 as a reference by using the metal plate 21 which is easily post-processed, so that the positional accuracy between the LED 23 and the reflector 12 can be improved. Further, the positional accuracy between the LED 23 and the projection lens 13 can be improved by the first mounting holes 21a and the second mounting holes 11a, so that the light distribution characteristics of the lamp unit 1 can be controlled with high accuracy.

Second Embodiment

Figure 5A:
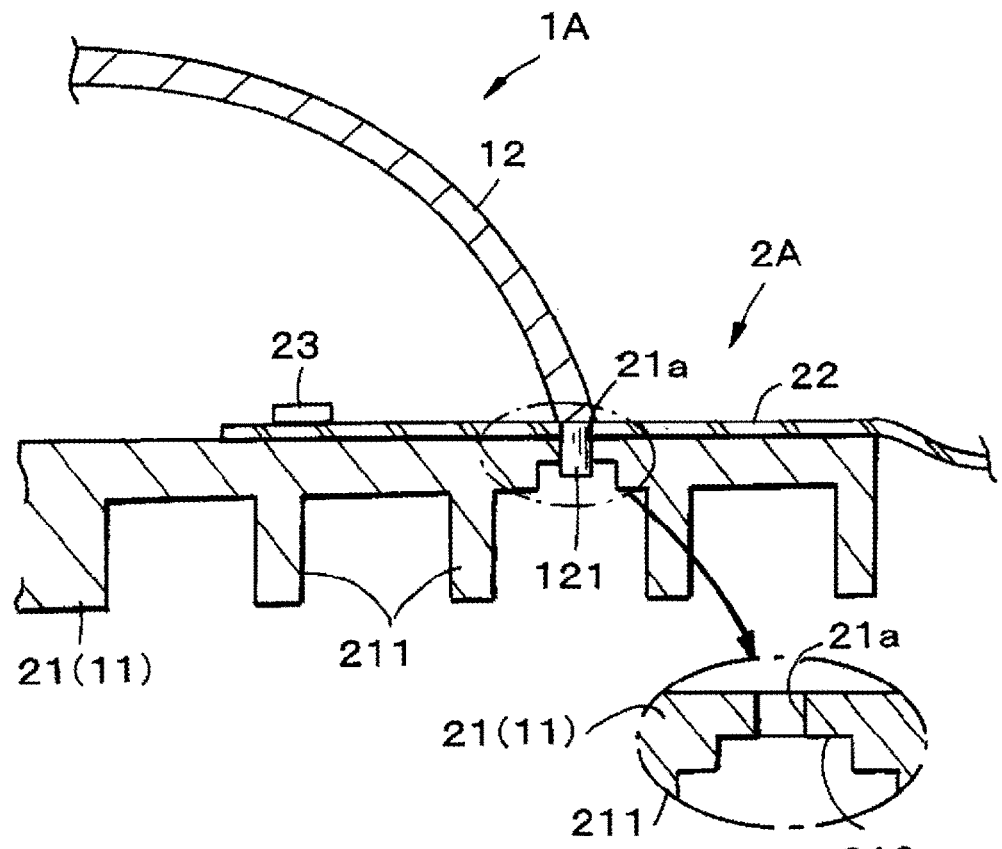
FIG. 5A is a partial sectional view of a lamp unit provided with a light source module in a second embodiment.
Figure 5B:
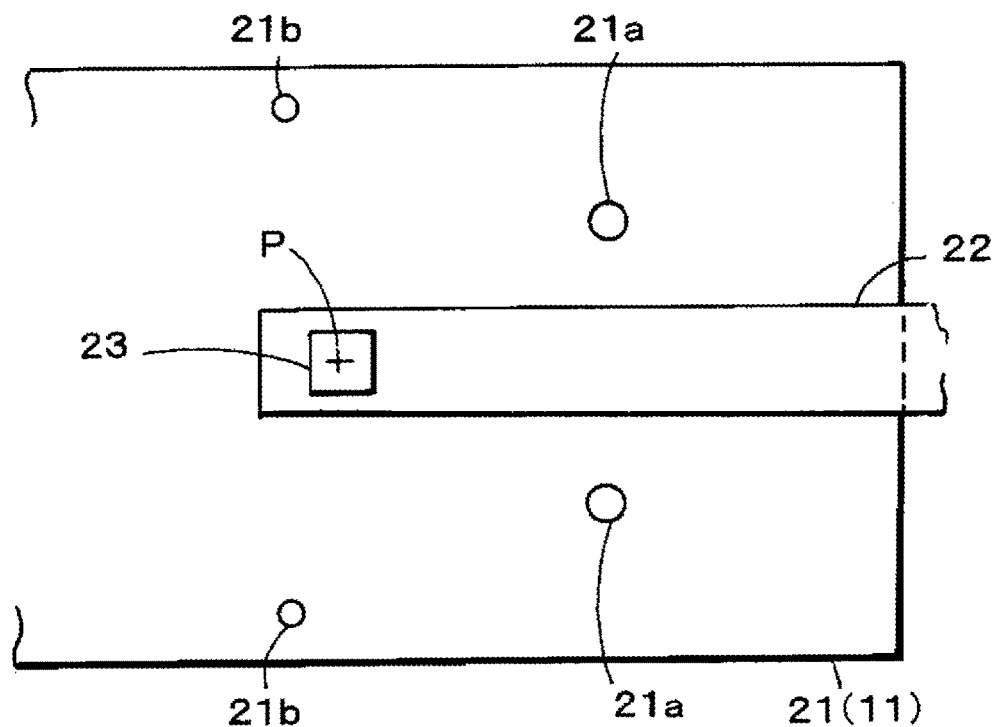
FIG. 5B is a schematic plan view of the light source module.
Figure 6:
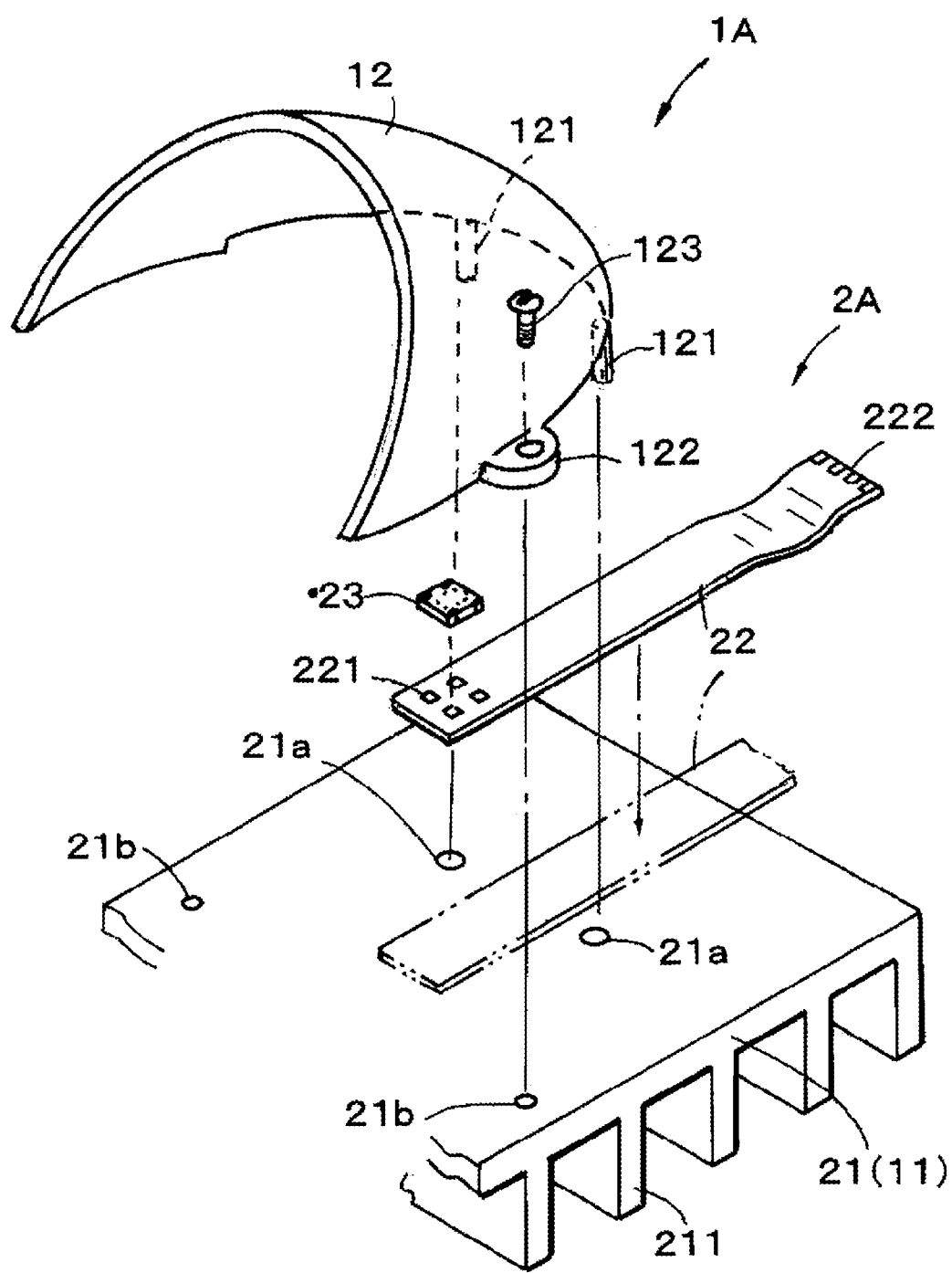
FIG. 6 is a partial exploded perspective view of the lamp unit according to the second embodiment.

FIGS. 5A and 5B are a partial sectional view of a lamp unit 1A according to a second embodiment and a plan view of a light source module 2A, and FIG. 6 is an exploded perspective view thereof. Meanwhile, the parts equivalent to those in the first embodiment are denoted by the same reference numerals. The light source module 2A in the second embodiment includes a thermally-conductive plate 21, the FPC 22, and the LED 23. However, the thermally-conductive plate 21 is configured as a part of the metallic base 11 of the lamp unit 1A. Therefore, in the following, the thermally-conductive plate 21 is referred to as the metal plate 21 (11) and will be described together with the manufacturing process thereof.

The FPC 22 is formed in an elongated strip shape. The pad 221 for mounting the LED 23 is formed at the area on one end side of the FPC 22 in the longitudinal direction, and the LED 23 is mounted on the FPC 22 by a flip chip with its light emitting surface directed upward. The FPC 22 is adhered to the surface of the metal plate 21 (11) over the area of required length from the area on the one end side with an adhesive. Further, the area on the other end side of the FPC 22 protrudes from the metal plate 21 (11) and is electrically connected to the lighting circuit device 4 (see FIG. 1) by the connector portion 222 provided at its end portion.

The FPC 22 is adhered to the surface (upper surface) of the metal plate 21 (11) constituted as a part of the base 11. On a back surface (lower surface) of the metal plate 21 (11), a plurality of wall-shaped fins 211 protruding downward are formed in an array form and also serve as a heat sink, as in the first embodiment.

Circular first mounting holes 21a are opened to penetrate in the plate thickness direction at two places of the metal plate 21 (11) sandwiching the FPC 22 in the width direction. As in the first embodiment, the opened positions of the two first mounting holes are set to positions where the light emission center P of the LED 23 is set as a reference position and the opened positions have a predetermined dimensional relationship with respect to the reference position respectively in the longitudinal direction and the width direction of the FPC 22.

Further, the reflector 12 is attached on the surface of the metal plate 21 (11) so as to cover a light source unit 2A. The reflector 12 has two columnar protrusions 121 formed to protrude downward at two places of its lower edge. These protrusions 121 are inserted through the first mounting holes 21*a*. Further, the reflector 12 is fixedly supported on the metal plate 21 (11) by screwing the screws 123 into screw holes 21*b* opened in the metal plate 21 (11) using the fixing pieces 122 provided on the reflector 12.

By referring to FIG. 1, in the lamp unit 1A provided with the light source module 2A, the LED 23 is supplied with power via the FPC 22 and emits light. The emitted light is reflected by the reflector 12 and is incident on the projection lens 13. Then, the projection lens 13 causes the emitted light to be irradiated to the front area of an automobile with a required light distribution. Further, the relative position relationship between the first mounting holes 21*a* formed in the metal plate 21 (11) constituted as a part of the base 11 and the LED 23 mounted thereon makes the reflector 12 and the projection lens 13 set to a predetermined relative position with respect to the LED 23 and a predetermined light distribution is obtained by the light emitted from the LED 23.

Also in the second embodiment, the LED 23 is supplied with power via the FPC 22, and thus, the power feeding board 21A as shown in FIGS. 4A and 4B can be configured by the metal plate 21 (11). In this way, the cost reduction can be achieved. Further, the heat generated when the LED 23 emits light is dissipated from the metal plate 21 (11) serving as a heat sink, that is, from the base 11, so that the heat dissipation effect can be improved.

Further, in the second embodiment, the metal plate 21 (11) is constituted as a part of the base 11. Therefore, the second mounting holes 11*a* in the first embodiment do not exist and it is only necessary to open the first mounting holes 21*a* in the metal plate 21 (11). Since a part of the base 11 constituting the metal plate 21 (11) is made of metal such as aluminum, the two first mounting holes 21*a* can be easily opened at predetermined positions with the light emission center P of the LED 23 as a reference after the LED 23 and the FPC 22 are supported on the metal plate 21 (11).

Therefore, as in the first embodiment, even when the accuracy when attaching the FPC 22 to the metal plate 21 (11) is about ±0.2 mm, regardless of this, the positional accuracy of the first mounting holes 21*a* relative to the light emission center P of the LED 23 can be made ±0.12 mm or less of the maximum accuracy in the drilling process. In this way, a decrease in the positional accuracy between the reflector 12 and the light emission center P of the LED 23 can be prevented and the light distribution characteristics by the reflector 12 and the projection lens 13 can be improved.

In the second embodiment, the plurality of heat dissipation fins 211 are formed in an array form on the metal plate 21 (11), and the first mounting holes 21*a* are opened at places where the heat dissipation fins 211 do not exist. Further, the metal plate 21 (11) is constituted as a part of the base 11 serving as a heat sink, and its plate thickness is set to be thicker than the metal plate of the first embodiment. Therefore, as shown in a partial enlarged view of FIG. 5A, thin-walled portions 212 whose plate thickness is partially reduced in advance are formed at places of the back surface of the metal plate 21 (11) where the first mounting holes 21*a* are opened, and the first mounting holes 21*a* are opened in the thin-walled portions 212, so that the operation of opening the first mounting holes 21*a* can be easily performed.

In the second embodiment, the light source module 2A includes the metal plate 21 (11) constituted as a part of the base 11, the FPC 22 and the LED 23, and a separate metal plate is not necessary. Therefore, the number of parts of the light source module 2A and the lamp unit 1A can be reduced, and the cost reduction can be achieved. Further, since the LED 23 is mounted on the FPC 22, the power feeding board made of ceramic or the like for constituting a circuit pattern is not necessary, and the cost reduction can be achieved. Furthermore, since the metal plate 21 (11) includes the heat dissipation fins 211, the heat dissipation effect of the LED 23 can be improved.

Since the first mounting holes 21*a* for attaching the reflector 12 are opened in the metal plate 21 (11) with the LED 23 mounted on the FPC 22 as a reference, the positional accuracy between the LED 23 and the reflector 12 can be improved. Further, since the projection lens 13 is positioned with respect to the base 11, the positional accuracy of the projection lens 13 relative to the metal plate 21 (11) constituted as a part of the base 11 can be improved. Therefore, the positional accuracy of the reflector 12 and the projection lens 13 relative to the LED 23 can be improved, so that the light distribution characteristics of the lamp unit 1A can be controlled with high accuracy.

In the first and second embodiments, the reflector 12 is supported with respect to the metal plate 21 and the base 11 by using the fixing pieces 122 provided on the reflector 12. However, the reflector 12 may be supported by forming a male groove or a female groove at the tip of each protrusion 121, inserting the protrusions 121 through the first mounting holes 21*a* and the second mounting holes 11*a*, and then, screwing nuts or screws from the lower side of the metal plate 21 (11) or the base 11.

In the first and second embodiments, the reflector 12 is supported using the mounting holes 21*a*, 11*a* provided in the metal plate 21 and the base 11 of the light source modules 2, 2A. However, in a lamp unit that does not have a reflector, for example, in a lamp unit configured to directly project light emitted from an LED by a projection lens, the projection lens may be supported using the mounting holes 21*a*, 11*a* provided in the metal plate 21 and the base 11. That is, an optical system of a lamp unit may be supported using mounting holes provided in a metal plate and a base. In this manner, the positioning accuracy of an optical system relative to an LED can be improved.

In the first and second embodiments, the reflector 12 is attached using the mounting holes 21*a* opened in the metal plate 21. However, the mounting portion of the optical system in the disclosure may be configured as a concave portion, a convex portion or other structures capable of supporting the optical system by being fitted to a convex portion or a concave portion provide in the optical system such as a reflector.

In the disclosure, the thermally-conductive plate may not be a metal plate. The thermally-conductive plate may be a low-cost plate which is formed of a material excellent in thermal conductivity and in which a circuit pattern by a wiring member is not formed. Further, the circuit board in the disclosure may not be an FPC and may be configured as a wiring board in which a required circuit pattern is formed. Furthermore, the light emitting element in the disclosure is not limited to an LED, but may be a light emitting element which is supplied with power via the circuit board and emits light, in particular, a semiconductor light emitting element.

Further, in the manufacturing process according to the disclosure, the process of attaching the circuit board to the thermally-conductive plate is not limited to the adhesion as in the embodiments. For example, the circuit board may be attached to the thermally-conductive plate using a screw or the like. Further, the process of providing the mounting portion at a predetermined position of the thermally-conductive plate with the light emitting element as a reference is also not limited to the process as in the embodiments, for example, the laser processing for forming the mounting holes. The structures other than the mounting holes may be mechanically processed.

What is claimed is:

1. A lamp unit comprising:
a light source module; and
an optical system for projecting light emitted from the light source module with a required light distribution,
wherein the light source module comprises a thermally-conductive plate, a circuit board attached to the thermally-conductive plate, and a light emitting element mounted on the circuit board and powered via the circuit board, and
wherein the thermally-conductive plate is provided with a mounting portion for mounting the optical system at a predetermined position with the light emitting element as a reference.

2. The lamp unit according to claim 1,
wherein the thermally-conductive plate includes a metal plate.

3. The lamp unit according to claim 1,
wherein the circuit board includes an FPC (Flexible Printed Circuit board) and is supported on the thermally-conductive plate, and the light emitting element is mounted on the FPC.

4. The lamp unit according to claim 1,
wherein the optical system comprises at least one of a reflector for reflecting light emitted from the light emitting element and a projection lens for projecting light emitted from the light emitting element with a required light distribution.

5. The lamp unit according to claim 4,
wherein the thermally-conductive plate includes a part of a base supporting the optical system.

6. The lamp unit according to claim 4,
wherein a mounting hole into which a protrusion provided on the optical system is inserted is opened as a mounting portion of the optical system in the thermally-conductive plate.

7. The lamp unit according to claim 6,
wherein a heat dissipation fin is formed on the thermally-conductive plate and the mounting hole is opened at a position avoiding the heat-dissipation fin.

8. The lamp unit according to claim 7,
wherein the mounting hole is opened at a thin-walled portion provided in the thermally-conductive plate.

9. A method of manufacturing a lamp unit, the method comprising:
a process of mounting a circuit board provided with a light emitting element on a thermally-conductive plate; and
a process of providing a mounting portion for mounting an optical system at a predetermined position of the thermally-conductive plate with the light emitting element as a reference.

10. The method according to claim 9,
wherein the process of providing the mounting portion includes a process of drilling a hole by a laser processing.

11. The lamp unit according to claim 1,
further comprising a base that that supports the optical system and includes heat dissipation fins;
wherein the thermally-conductive plate includes a first planar surface and a second planar surface opposite the first planar surface, the circuit board directly abuts the first planar surface and the base directly abuts the second planar surface.

* * * * *